(12) United States Patent
Lee et al.

(10) Patent No.: US 11,574,833 B2
(45) Date of Patent: Feb. 7, 2023

(54) ELECTROSTATIC CHUCK

(71) Applicant: Samsung Display Co., Ltd., Yongin-si (KR)

(72) Inventors: Juhee Lee, Hwaseong-si (KR); Cheollae Roh, Seongnam-si (KR); Soo Beom Jo, Incheon (KR); Myungsoo Huh, Suwon-si (KR); Voronov Alexander, Suwon-si (KR); Jiwon Yeon, Gwangmyeong-si (KR); Haeyoung Yoo, Asan-si (KR); Yongmun Chang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 17/172,056

(22) Filed: Feb. 9, 2021

(65) Prior Publication Data
US 2021/0358791 A1    Nov. 18, 2021

(30) Foreign Application Priority Data

May 18, 2020 (KR) .................. 10-2020-0059262

(51) Int. Cl.
*H02N 13/00* (2006.01)
*H01L 21/683* (2006.01)
*B23Q 3/15* (2006.01)

(52) U.S. Cl.
CPC ............ *H01L 21/6833* (2013.01); *B23Q 3/15* (2013.01); *H01L 21/6831* (2013.01); *H02N 13/00* (2013.01); *H01L 21/683* (2013.01)

(58) Field of Classification Search
CPC . H01L 21/683; H01L 21/6833; H01L 21/687; H01L 21/50; H01L 21/6831; H02H 13/00; B23Q 3/15
USPC .......................................................... 361/234
See application file for complete search history.

(56) References Cited

U.S. PATENT DOCUMENTS

| | | | | |
|---|---|---|---|---|
| 4,692,836 | A * | 9/1987 | Suzuki | H01L 21/6831 |
| | | | | 279/128 |
| 5,880,923 | A * | 3/1999 | Hausmann | H01L 21/6833 |
| | | | | 279/128 |
| 9,455,172 | B2 * | 9/2016 | Van Empel | H01L 21/6833 |
| 2010/0277850 | A1 * | 11/2010 | Chang | H01L 21/6831 |
| | | | | 118/712 |
| 2014/0104743 | A1 * | 4/2014 | Park | H01L 51/56 |
| | | | | 361/234 |
| 2015/0162231 | A1 * | 6/2015 | Cox | H01L 21/6838 |
| | | | | 29/559 |

FOREIGN PATENT DOCUMENTS

| | | |
|---|---|---|
| KR | 10-0994505 | 11/2010 |
| KR | 10-1721684 | 4/2017 |
| KR | 10-2017-0073055 | 6/2017 |
| KR | 20190106119 | 9/2019 |

\* cited by examiner

*Primary Examiner* — Danny Nguyen
(74) *Attorney, Agent, or Firm* — H.C. Park & Associates, PLC

(57) ABSTRACT

An electrostatic chuck fixes a substrate and includes a first area and a second area adjacent to the first area. The electrostatic chuck includes a first electrode portion disposed in the first area and a second electrode portion disposed in the second area. The first electrode portion has a first width, and the second electrode portion has a second width smaller than the first width.

19 Claims, 12 Drawing Sheets

ELECTROSTATIC CHUCK

CROSS-REFERENCE TO RELATED APPLICATION

This application claims priority from and the benefit of Korean Patent Application No. 10-2020-0059262, filed on May 18, 2020, which is hereby incorporated by reference for all purposes as if fully set forth herein.

BACKGROUND

Field

Exemplary embodiments/implementations of the invention relate generally to an electrostatic chuck that fixes a substrate using an electrostatic force.

Discussion of the Background

Various electronic devices, such as smartphones, tablet computers, notebook computers, and smart televisions, are being developed. The electronic devices include a display device to provide information. Various processes, such as a deposition process of forming a thin film on a substrate using a predetermined material, a photolithography process of exposing a selected portion of the thin film, a dry or wet etching process of removing the exposed portion of the thin film to pattern the thin film to a desired shape, and the like, are repeatedly performed on the display device. Among the processes, a deposition process and a dry etching process are usually performed in a closed process chamber, and an electrostatic chuck is provided in the process chamber to fix the substrate.

The above information disclosed in this Background section is only for understanding of the background of the inventive concepts, and, therefore, it may contain information that does not constitute prior art.

SUMMARY

Devices constructed according to exemplary embodiments of the invention are capable of providing an electrostatic chuck that controls an electrostatic force applied to a substrate.

Devices constructed according to exemplary embodiments of the invention are also capable of providing an electrostatic chuck that has improved process reliability.

Additional features of the inventive concepts will be set forth in the description which follows, and in part will be apparent from the description, or may be learned by practice of the inventive concepts.

One or more exemplary embodiments of the inventive concepts provide an electrostatic chuck fixing a substrate and including a first area defined therein and a second area adjacent to the first area and defined therein. The electrostatic chuck includes a first electrode portion disposed in the first area and having a first width and a second electrode portion disposed in the second area and having a second width smaller than the first width.

The first width may be in a range from about 3 millimeters to about 10 millimeters, and the second width may be in a range from about 1 millimeter to about 2 millimeters.

The second area may surround the first area.

The electrostatic chuck may further include a first power source providing a first voltage to the first electrode portion and a second power source providing a second voltage to the second electrode portion.

The first voltage may be lower than the second voltage.

The electrostatic chuck may further include a power source providing a voltage to the first electrode portion and the second electrode portion, a first variable resistor electrically connected between the first electrode portion and the power source, and a second variable resistor electrically connected between the second electrode portion and the power source.

The first variable resistor may have a resistance value greater than a resistance value of the second variable resistor.

The electrostatic chuck may further include a third electrode portion disposed in the first area and spaced apart from the first electrode portion by a first gap and a fourth electrode portion disposed in the second area and spaced apart from the second electrode portion by a second gap. The first gap may be smaller than the first width, and the second gap may be equal to the second width.

The first gap may be equal to or greater than the second gap.

The first gap may be in a range from about 1 millimeter to about 1.5 millimeters, and the second gap is about 1 millimeter.

Each of the first electrode portion, the second electrode portion, the third electrode portion, and the fourth electrode portion may be provided in plural, the first electrode portions may be alternately arranged with the third electrode portions, and the second electrode portions may be alternately arranged with the fourth electrode portions.

The electrostatic chuck may further include a third area that is defined therein to be disposed between the first area and the second area and to surround the first area and a third electrode portion disposed in the third area. The first electrode portion, the second electrode portion, and the third electrode portion may receive different voltages from each other.

The electrostatic chuck may further include a first power source providing a first voltage to the first electrode portion, a second power source providing a second voltage different from the first voltage to the second electrode portion, and a third power source providing a third voltage different from the first and second voltages to the third electrode portion.

The electrostatic chuck may further include a power source providing the voltages, a first variable resistor electrically connected between the power source and the first electrode portion, a second variable resistor electrically connected between the power source and the second electrode portion, and a third variable resistor electrically connected between the power source and the third electrode portion.

The first variable resistor may have a resistance value greater than a resistance value of each of the second and third variable resistors.

One or more exemplary embodiments of the inventive concepts may also provide an electrostatic chuck fixing a substrate and including a plurality of areas defined therein. The electrostatic chuck includes a plurality of first electrode portions disposed in a first area among the areas, a plurality of second electrode portions disposed in a second area among the areas, a plurality of third electrode portions disposed in the first area, and a plurality of fourth electrode portions disposed in the second area. The first electrode portions are arranged at a first pitch, the second electrode portions are arranged at a second pitch smaller than the first pitch, the third electrode portions are arranged at a pitch that is equal to the first pitch, and the fourth electrode portions are arranged at a pitch that is equal to the second pitch.

The first electrode portions may be alternately arranged with the third electrode portions, the first electrode portions and the third electrode portions may have a first width, the second electrode portions may be alternately arranged with the fourth electrode portions, and the second electrode portions and the fourth electrode portions may have a second width equal to or smaller than the first width.

A first voltage may be applied to the first electrode portions, and a second voltage higher than the first voltage may be applied to the second electrode portions.

The electrostatic chuck may further include a power source providing a voltage to the first electrode portions, the second electrode portions, the third electrode portions, and the fourth electrode portions, a first variable resistor electrically connected between the first electrode portions and the power source and dropping the voltage to the first voltage, and a second variable resistor electrically connected between the second electrode portions and the power source and dropping the voltage to the second voltage.

The electrostatic chuck may further include a first power source providing the first voltage and a second power source providing the second voltage.

According to the above, the electrostatic chuck includes the first area and the second area adjacent to the first area, which are defined therein. The first electrode portion disposed in the first area has the area greater than the area of the second electrode portion disposed in the second area. When the voltage applied to the first area is the same as the voltage applied to the second area, the electrostatic force generated in the first area is greater than that generated in the second area. Thus, even though the voltage applied to the first area is lower than the voltage applied to the second area, the electrostatic force that is enough to chuck the substrate may be secured.

In addition, since the voltage applied to the first area is lower than the voltage applied to the second area, the possibility that the electrode is damaged due to the voltage applied thereto is reduced and the probability that the accumulation of charges in the first area due to the leakage current is reduced. Thus, the electrostatic chuck with improved process reliability is provided.

According to the present disclosure, the plural power sources are electrically connected to electrodes disposed in separates areas, respectively, and independently provide different voltages for respective areas to electrodes, thereby controlling the electrostatic force of the electrostatic chuck applied to the substrate.

According to the present disclosure, the electrostatic chuck independently provides different voltages for respective areas using the plural variable resistors connected to one power source to control the electrostatic force of the electrostatic chuck applied to the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
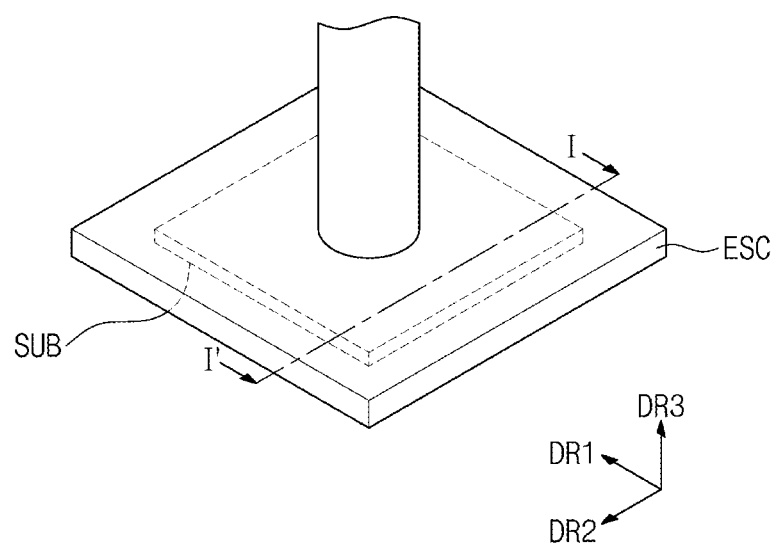
FIG. 1 is a perspective view showing a substrate and an electrostatic chuck according to an embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present disclosure will be described with reference to accompanying drawings.

Figure 2:
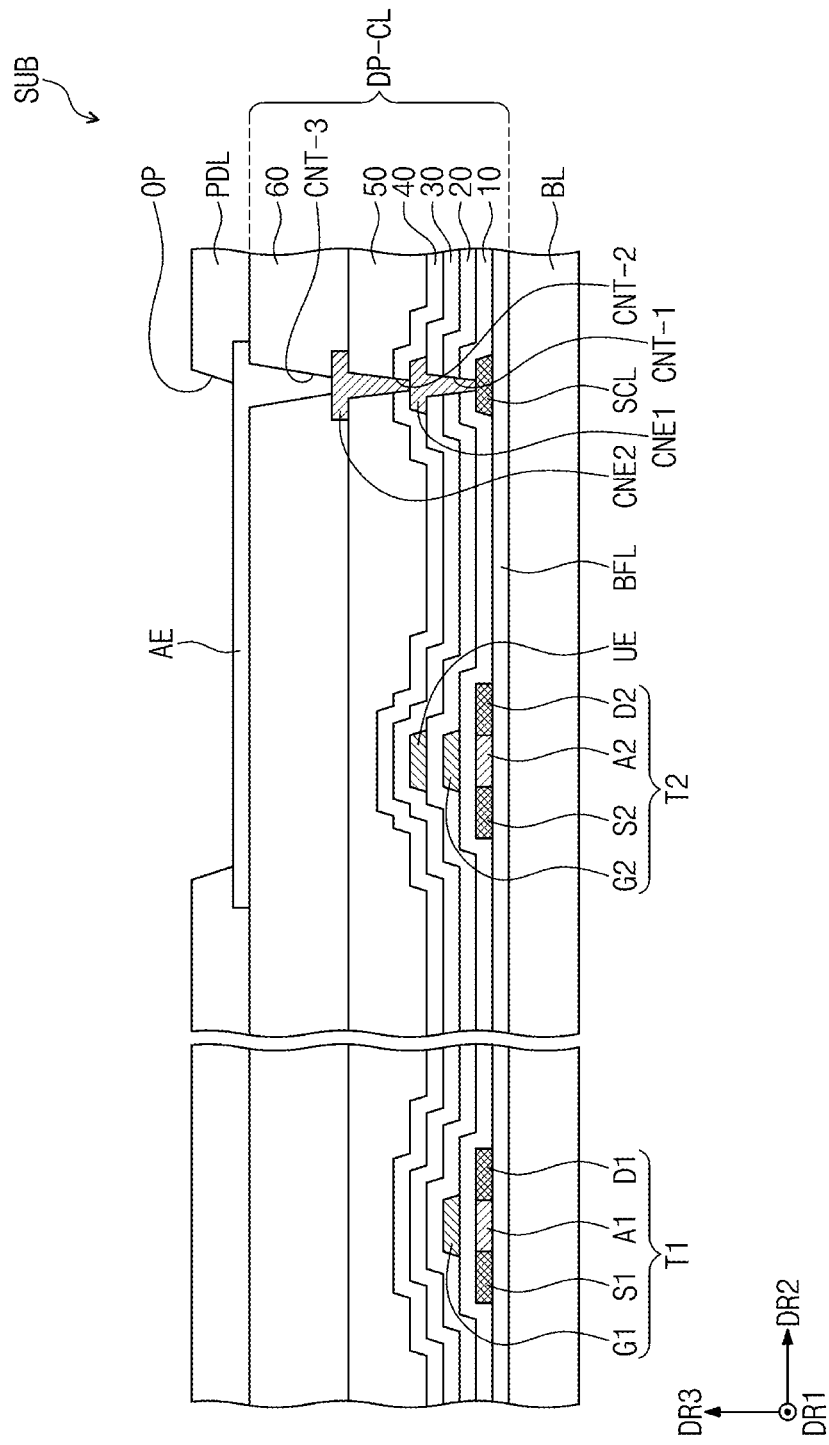
FIG. 2 is a cross-sectional view showing a portion of a substrate according to an embodiment of the present disclosure.

FIG. 1 is a perspective view showing a substrate SUB and an electrostatic chuck ESC according to an embodiment of the present disclosure. FIG. 2 is a cross-sectional view showing a portion of the substrate SUB according to an embodiment of the present disclosure.

Referring to FIGS. 1 and 2, the electrostatic chuck ESC may generate an electrostatic force using an electrostatic induction phenomenon to chuck or dechuck the substrate SUB.

The substrate SUB may be a portion of an organic light emitting panel that includes organic light emitting devices.

The substrate SUB may include a surface substantially parallel to a surface defined by a first direction DR1 and a second direction DR2. A third direction DR3 indicates a thickness direction of the substrate SUB. Front (or upper) and rear (or lower) surfaces of the substrate SUB may be distinguished from each other by the third direction DR3. The third direction DR3 may cross the first direction DR1 and the second direction DR2. For example, the first, second, and third directions DR1, DR2, and DR3 may be substantially perpendicular to each other. In the present disclosure, the surface defined by the first direction DR1 and the second direction DR2 may be defined as a plane, and the expression "when viewed in a plane" or "in plan view" may mean a state of being viewed in the third direction DR3.

The substrate SUB may include a base layer BL, a circuit layer DP-CL, an electrode AE, and a pixel definition layer PDL.

The base layer BL may include a synthetic resin film. The base layer BL may have a multi-layer structure. For instance, the base layer BL may have a three-layer structure of a synthetic resin layer, an adhesive layer, and a synthetic resin layer. In particular, the synthetic resin layer may be a polyimide-based resin layer. However, this is merely exemplary, and the type of the synthetic resin layer should not be limited thereto or thereby. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin.

At least one inorganic layer may be formed on an upper surface of the base layer BL. The inorganic layer may include at least one of aluminum oxide, titanium oxide, silicon oxide, silicon oxynitride, zirconium oxide, and hafnium oxide. The inorganic layer may be provided in plural. The inorganic layers may form a barrier layer and/or a buffer layer. In the present embodiment, the substrate SUB includes the buffer layer BFL.

The circuit layer DP-CL may include the buffer layer BFL, a first transistor T1, a second transistor T2, a first insulating layer 10, a second insulating layer 20, a third insulating layer 30, a fourth insulating layer 40, a fifth insulating layer 50, and a sixth insulating layer 60.

The buffer layer BFL may improve a coupling force between the base layer BL and a semiconductor pattern. The buffer layer BFL may include a silicon oxide layer and a silicon nitride layer. The silicon oxide layer and the silicon nitride layer may be alternately stacked with each other.

The semiconductor pattern may be disposed on the buffer layer BFL. The semiconductor pattern may include polysilicon, however, it should not be limited thereto or thereby. For example, the semiconductor pattern may include amorphous silicon or metal oxide.

The semiconductor pattern may have different electrical properties depending on whether it is doped. The semiconductor pattern may include a doped region and a non-doped region. The doped region may be doped with an N-type dopant or a P-type dopant. An N-type transistor may include the doped region doped with the N-type dopant. A P-type transistor may include the doped region doped with the P-type dopant.

The doped region may have a conductivity greater than that of the non-doped region and may substantially act as an electrode or a signal line. The non-doped region may substantially correspond to an active (or a channel) of a transistor. In other words, a portion of the semiconductor pattern may be the active of the transistor, another portion of the semiconductor pattern may be a source or drain of the transistor, and the other portion of the semiconductor pattern may be a connection electrode or a connection signal line.

The transistor may include the first transistor T1 and the second transistor T2. The first transistor T1 may include a source S1, an active A1, a drain D1, and a gate G1. The second transistor T2 may include a source S2, an active A2, a drain D2, and a gate G2.

The source S1, the active A1, and the drain D1 of the first transistor T1 may be formed using the semiconductor pattern, and the source S2, the active A2, and the drain D2 of the second transistor T2 may be formed using the semiconductor pattern. The sources S1 and S2 and the drains D1 and D2 may extend in opposite directions from the actives A1 and A2 in the cross section.

FIG. 2 shows a portion of the connection signal line SCL formed using the semiconductor pattern. Although not shown separately, the connection signal line SCL may be connected to the drain D2 of the second transistor T2 when viewed in a plane.

The first insulating layer 10 may be disposed on the buffer layer BFL. The first insulating layer 10 may cover the first transistor T1 and the second transistor T2. The first insulating layer 10 may include an inorganic layer and/or an organic layer and may have a single-layer or multi-layer structure. An insulating layer of the circuit layer DP-CL described later includes an inorganic layer and/or an organic layer and may have a single-layer or multi-layer structure as does the first insulating layer 10.

The gates G1 and G2 may be disposed on the first insulating layer 10. The gates G1 and G2 may be a portion of a metal pattern. The gates G1 and G2 may overlap the actives A1 and A2, respectively, when viewed in a plane.

The second insulating layer 20 may be disposed on the first insulating layer 10. The second insulating layer 20 may cover the gates G1 and G2.

An upper electrode UE may be disposed on the second insulating layer 20. The upper electrode UE may overlap the gate G2 of the second transistor T2 when viewed in a plane. The upper electrode UE may be a portion of the metal pattern. The portion of the gate G2 and the upper electrode UE overlapping the portion of the gate G2 may define a capacitor. However, this is merely exemplary, and the upper electrode UE may be omitted.

The third insulating layer 30 may be disposed on the second insulating layer 20. The third insulating layer 30 may cover the upper electrode UE. A first connection electrode CNE1 may be disposed on the third insulating layer 30. The first connection electrode CNE1 may be connected to the connection signal line SCL through a contact hole CNT-1 penetrating through the first, second, and third insulating layers 10, 20, and 30.

The fourth insulating layer 40 may be disposed on the third insulating layer 30. The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 penetrating through the fourth and fifth insulating layers 40 and 50.

The sixth insulating layer 60 may be disposed on the fifth insulating layer 50. The sixth insulating layer 60 may cover the second connection electrode CNE2. The sixth insulating layer 60 may be an organic layer.

The electrode AE may be disposed on the sixth insulating layer 60. The electrode AE may be connected to the second connection electrode CNE2 through a contact hole CNT-3 penetrating through the sixth insulating layer 60.

The pixel definition layer PDL may be disposed on the electrode AE and the sixth insulating layer 60. An opening OP may be defined through the pixel definition layer PDL. At least a portion of the electrode AE may be exposed through the opening OP of the pixel definition layer PDL.

The electrostatic chuck ESC may chuck the substrate SUB to perform a process of treating the substrate SUB and may dechuck the substrate SUB to perform a next process after processing the substrate SUB, and the chucking and dechucking operations may be performed repeatedly.

The electrostatic chuck ESC may chuck the substrate SUB in a direction opposite to a gravity direction. The substrate SUB may be processed after being provided such that the pixel definition layer PDL faces down. For example, a deposition source that includes a deposition material may be disposed under the electrostatic chuck ESC. The deposition material may be, for example, a light emitting material constituting a light emitting layer. The deposition material may be deposited on the electrode AE of the substrate SUB to form the light emitting layer.

FIGS. 3A to 3D are perspective views showing a substrate SUB and electrostatic chucks ESC-1, ESC-2, ESC-3, and ESC-4 according to embodiments of the present disclosure.

Figure 3A:
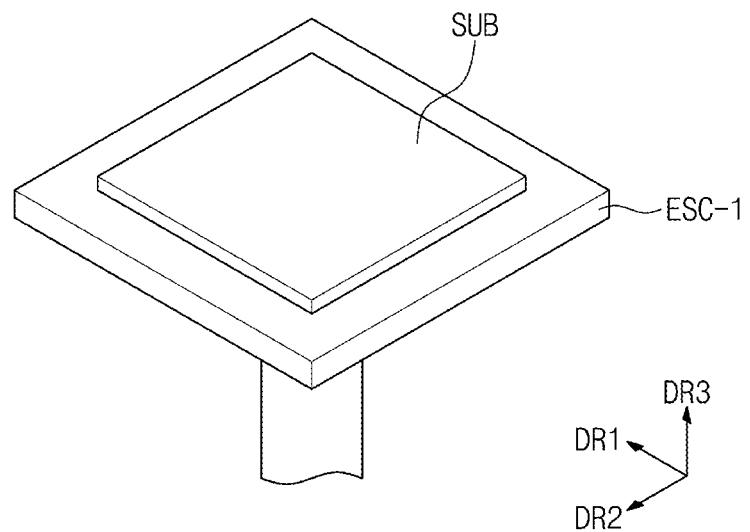
FIGS. 3A, 3B, 3C, and 3D are perspective views showing a substrate and electrostatic chucks according to embodiments of the present disclosure.

Referring to FIG. 3A, the electrostatic chuck ESC-1 may be disposed under the substrate SUB. The electrostatic chuck ESC-1 may chuck the substrate SUB in the gravity direction.

Figure 3B:
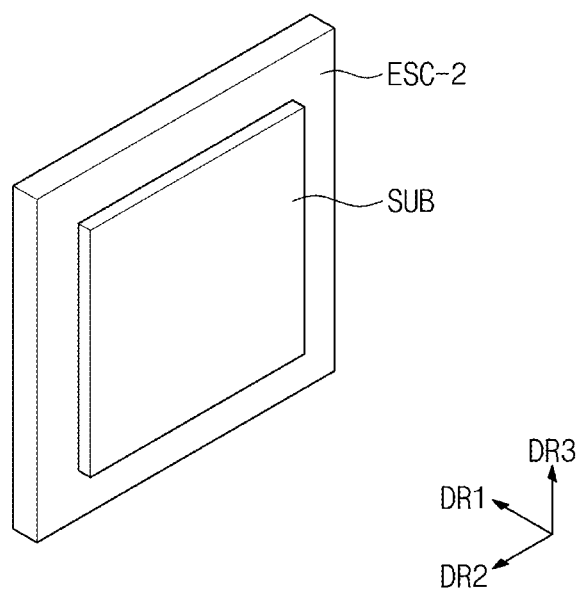

Referring to FIG. 3B, the electrostatic chuck ESC-2 may chuck the substrate SUB in a first direction DR1. The substrate SUB may be processed while facing the first direction DR1.

Figure 3C:
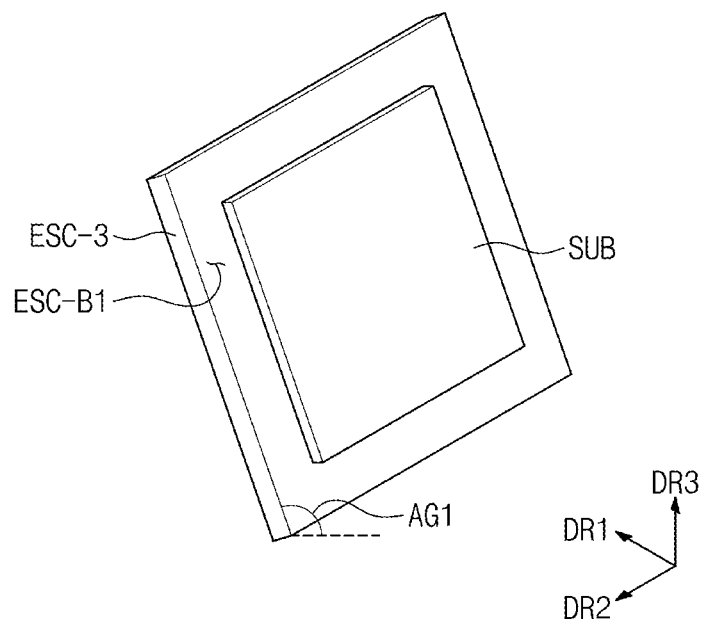

Referring to FIG. 3C, the electrostatic chuck ESC-3 may chuck the substrate SUB such that the substrate SUB is inclined at a predetermined angle AG1. The predetermined angle AG1 may be an angle between a surface ESC-B1 of the electrostatic chuck ESC-3, which is in contact with the substrate SUB, and a plane defined by the first direction DR1 and the second direction DR2. The predetermined angle AG1 may be an obtuse angle. The substrate SUB may be processed while being inclined at the predetermined angle AG1.

Figure 3D:
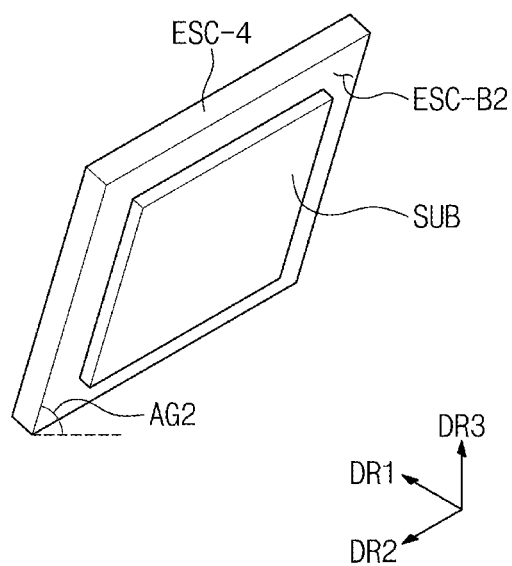

Referring to FIG. 3D, the electrostatic chuck ESC-4 may chuck the substrate SUB such that the substrate SUB is inclined at a predetermined angle AG2. The predetermined angle AG2 may be an angle between a surface ESC-B2 of the electrostatic chuck ESC-4, which is in contact with the substrate SUB, and the plane defined by the first direction DR1 and the second direction DR2. The predetermined angle AG2 may be an acute angle. The substrate SUB may be processed while being inclined at the predetermined angle AG2.

Figure 4:
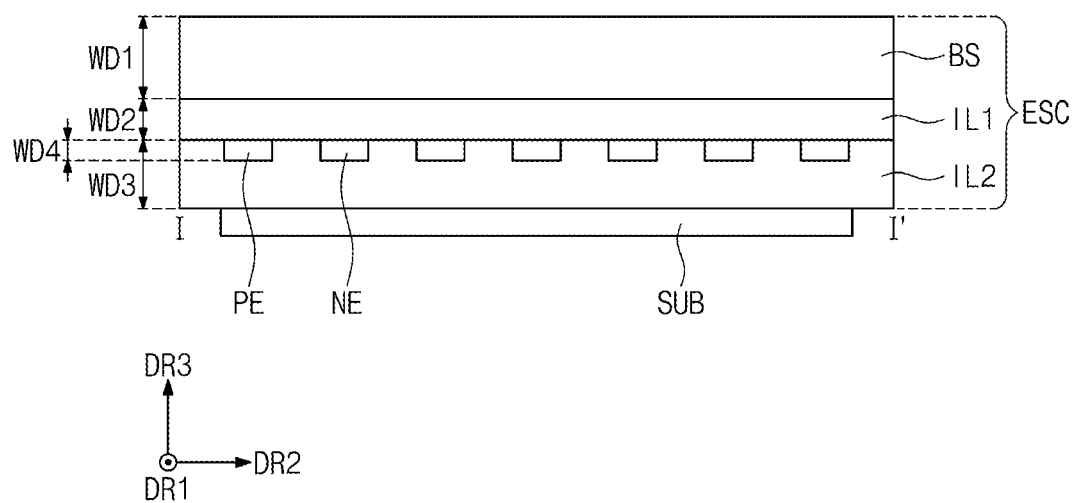
FIG. 4 is a cross-sectional view taken along a line I-I' of FIG. 1 according to an embodiment of the present disclosure.

FIG. 4 is a cross-sectional view taken along a line I-I' of FIG. 1 according to an embodiment of the present disclosure.

Referring to FIG. 4, the electrostatic chuck ESC may include a chuck body BS, a first insulating layer ILL a second insulating layer IL2, a plurality of positive electrodes PE, and a plurality of negative electrodes NE.

The chuck body BS may be disposed on the substrate SUB. The chuck body BS may include a ceramic material. However, this is merely exemplary, and the material of the chuck body BS should not be limited thereto or thereby. For example, the chuck body BS according to the embodiment of the present disclosure may include aluminum (Al), titanium (Ti), stainless steel, alumina (Al2O3), yttrium Oxide (Y2O3), or aluminum nitride.

The first insulating layer IL1 may be disposed under the chuck body BS. The first insulating layer IL1 may include a material having higher heat resistance and chemical stability than those of the second insulating layer IL2. For example, the first insulating layer IL1 may include yttrium Oxide (Y2O3). However, this is merely exemplary, the material of the first insulating layer IL1 should not be limited thereto or thereby, and the first insulating layer IL1 may include a variety of materials with the heat resistance and the chemical stability.

The first insulating layer IL1 may have a thickness WD2 smaller than a thickness WD1 of the chuck body BS. The thickness WD2 of the first insulating layer IL1 may be in a range from about 80 micrometers to about 100 micrometers. The thickness WD1 of the chuck body BS may be in a range from about 10 millimeters to about 20 millimeters.

The second insulating layer IL2 may be disposed under the first insulating layer IL1. The second insulating layer IL2 may include a material having higher thermal conductivity and dielectric properties than those of the first insulating layer IL1. For example, the second insulating layer IL2 may include alumina (Al2O3). However, this is merely exemplary, the material of the second insulating layer IL2 should not be limited thereto or thereby, and the second insulating layer IL2 may include a variety of materials with the thermal conductivity.

The second insulating layer IL2 may have a thickness WD3 greater than the thickness WD2 of the first insulating layer IL1. The thickness WD3 of the second insulating layer IL2 may be smaller than the thickness WD1 of the chuck body BS. The thickness WD3 of the second insulating layer IL2 may be in a range from about 110 micrometers to about 150 micrometers.

The positive electrodes PE and the negative electrodes NE may be disposed between the first insulating layer IL and the second insulating layer IL2. The second insulating layer IL2 may cover the positive electrodes PE and the negative electrodes NE. The positive electrodes PE and the negative electrodes NE may have different polarities from each other. The positive electrodes PE may be alternately arranged with the negative electrodes NE.

The positive electrodes PE and the negative electrodes NE may include tungsten (W). However, this is merely exemplary, and the material of each of the positive electrodes PE and the negative electrodes NE should not be limited thereto or thereby. For example, each of the positive electrodes PE and the negative electrodes NE may include silver (Ag) or copper (Cu).

The positive electrodes PE and the negative electrodes NE may have substantially the same thickness WD4. The thickness WD4 of each of the positive electrodes PE and the negative electrodes NE may be smaller than that of the first insulating layer IL1 and the second insulating layer IL2. The thickness WD4 of each of the positive electrodes PE and the negative electrodes NE may be in a range from about 25 micrometers to about 35 micrometers.

A positive DC voltage may be applied to the positive electrodes PE. A first electrostatic force may be generated between the positive electrodes PE and the substrate SUB. A negative DC voltage may be applied to the negative electrodes NE. A second electrostatic force may be generated between the negative electrodes NE and the substrate SUB. The first electrostatic force and the second electrostatic force may be the electrostatic force.

The electrostatic chuck ESC according to the embodiment of the present disclosure may be a bipolar electrostatic chuck. However, this is merely exemplary, and the type of the electrostatic chuck ESC according to the embodiment should not be limited thereto or thereby. For example, the electrostatic chuck ESC may be a monopolar electrostatic chuck. In this case, a DC voltage having the same polarity may be applied to the positive electrodes PE and the negative electrodes NE of the electrostatic chuck ESC. In the monopolar electrostatic chuck, the positive electrodes PE and the negative electrodes NE may be called electrodes.

When the positive DC voltage is applied to each of the positive electrodes PE, upper portions of a first area of the substrate SUB, which respectively overlap the positive electrodes PE, may be charged with a negative potential. The electrostatic force may be generated between the positive electrodes PE and the first area due to electric charges.

When the negative DC voltage is applied to each of the negative electrodes NE, upper portions of a second area of the substrate SUB, which respectively overlap the negative electrodes NE, may be charged with a positive potential. The electrostatic force may be generated between the negative electrodes NE and the second area due to electric charges.

Figure 5:
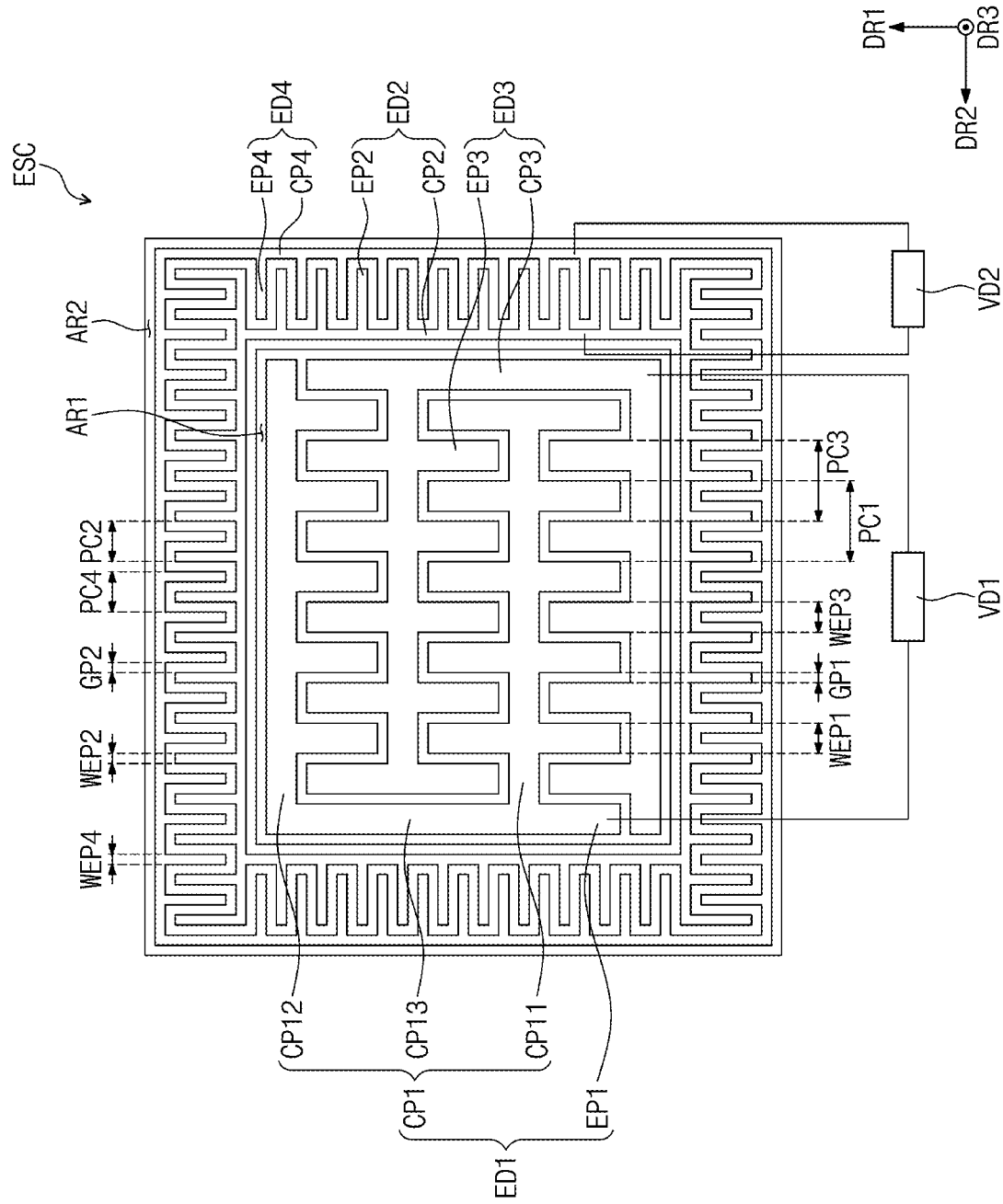
FIG. 5 is a plan view showing some of components of an electrostatic chuck according to an embodiment of the present disclosure.

FIG. 5 is a view showing some of components of the electrostatic chuck ESC according to an embodiment of the present disclosure.

Referring to FIG. 5, the electrostatic chuck ESC may include a first electrode ED1, a second electrode ED2, a third electrode ED3, a fourth electrode ED4, a first power VD1, and a second power VD2, where each "power" hereinafter refers to a power source or branch thereof having a discrete voltage and current.

The electrostatic chuck ESC may include a first area AR1 and a second area AR2 adjacent to the first area AR1, which are defined therein. The second area AR2 may surround the first area AR1. For example, the first area AR1 may have a quadrangular shape, and the second area AR2 may have a quadrangular ring shape. However, this is merely exemplary, and the first and second areas AR1 and AR2 may have a variety of shapes without being limited to the quadrangular shape and the quadrangular ring shape.

The first electrode ED1 may be disposed in the first area AR1. The first electrode ED1 may include a first connection portion CP1 and a plurality of first electrode portions EP1.

The first connection portion CP1 may include a first portion CP11, a second portion CP12, and a third portion CP13. The first portion CP11 may extend in a second direction DR2. The second portion CP12 may extend in the second direction DR2 and may be spaced apart from the first portion CP11 in a first direction DR1. The third portion CP13 may extend from one end of the first portion CP11 and one end of the second portion CP12 in the first direction DR1.

A plurality of first electrode portions EP1 may protrude from the first connection portion CP1. The first electrode portions EP1 may be referred to as the positive electrodes PE (refer to FIG. 4).

Each of the first electrode portions EP1 may have a first width WEP1. The first width WEP1 may be in a range from about 3 millimeters to about 10 millimeters. For example, the first width WEP1 may be about 4 millimeters. The first width WEP1 of the first electrode portion EP1 should not be particularly limited as long as the first width WEP1 of the first electrode portion EP1 is greater than a second width WEP2 of second electrode portions EP2 described later.

The first electrode portions EP1 may be arranged at a first pitch PC1. The first pitch PC1 may be in a range from about 8 millimeters to about 23 millimeters. For example, the first pitch PC1 may be about 10 millimeters. However, this is merely exemplary, and the first pitch PC1 according to the embodiment of the present disclosure should not be limited thereto or thereby.

The second electrode ED2 may be disposed in the second area AR2. The second electrode ED2 may include a second connection portion CP2 and the second electrode portions EP2.

The second connection portion CP2 may be disposed along an inner periphery of the second area AR2. The second electrode portions EP2 may protrude from the second connection portion CP2. The second electrode portions EP2 may be referred to as the positive electrodes PE (refer to FIG. 4).

Each of the second electrode portions EP2 may have the second width WEP2. The second width WEP2 may be smaller than the first width WEP1. The second width WEP2 may be in a range from about 1 millimeter to about 2 millimeters. For example, the second width WEP2 may be about 1 millimeter.

The second electrode portions EP2 may be arranged at a second pitch PC2. The second pitch PC2 may be in a range from about 4 millimeters to about 5 millimeters. For example, the second pitch PC2 may be about 1 millimeter. However, this is merely exemplary, and the second pitch PC2 according to the embodiment of the present disclosure should not be limited thereto or thereby. The second pitch PC2 may be smaller than the first pitch PC1.

The third electrode ED3 may be disposed in the first area AR1. The third electrode ED3 may include a third connection portion CP3 and a plurality of third electrode portions EP3.

The third connection portion CP3 may be spaced apart from the first connection portion CP1 and may have a shape surrounding a portion of the first connection portion CP1. The third electrode portions EP3 may protrude from the third connection portion CP3. The third electrode portions EP3 may be referred to as the negative electrodes NE (refer to FIG. 4).

Each of the third electrode portions EP3 may have a third width WEP3. The third width WEP3 may be the same as the first width WEP1.

A gap between the third electrode portions EP3 may be referred to as a third pitch PC3. The third pitch PC3 may be the same as the first pitch PC1.

The third electrode portions EP3 may be spaced apart from the first electrode portions EP1 by a first gap GP1. The first gap GP1 may be smaller than the first width WEP1 and the third width WEP3. The first gap GP1 may be in a range from about 1 millimeter to about 1.5 millimeters. For example, the first gap GP1 may be about 1 millimeter.

The first electrode portions EP1 may be alternately arranged with the third electrode portions EP3. For example, the first electrode ED1 and the third electrode ED3 may have an interdigitated pattern. The interdigitated pattern may mean a pattern formed by interdigitating positive and negative electrodes having the form of fingers.

The fourth electrode ED4 may be disposed in the second area AR2. The fourth electrode ED4 may include a fourth connection portion CP4 and a plurality of fourth electrode portions EP4.

The fourth connection portion CP4 may be arranged along an outer periphery of the first area AR1. The fourth electrode portions EP4 may protrude from the fourth connection portion CP4. The fourth electrode portions EP4 may be referred to as the negative electrodes NE (refer to FIG. 4).

Each of the fourth electrode portions EP4 may have a fourth width WEP4. The fourth width WEP4 may be the same as the second width WEP2.

A gap between the fourth electrode portions EP4 may be referred to as a fourth pitch PC4. The fourth pitch PC4 may be the same as the second pitch PC2.

The fourth electrode portions EP4 may be spaced apart from the second electrode portions EP2 by a second gap GP2. The second gap GP2 may be the same as the second width WEP2 and the fourth width WEP4. The second gap GP2 may be smaller than the first gap GP1. For example, the second gap GP2 may be about 1 millimeter.

The second electrode portions EP2 may be alternately arranged with the fourth electrode portions EP4. For example, the second electrode ED2 and the fourth electrode ED4 may have the interdigitated pattern.

The first power VD1 may be electrically connected to the first electrode ED1 and the third electrode ED3. The first power VD1 may provide a direct current voltage to the first electrode ED1 and the third electrode ED3. The first power VD1 may apply a first voltage having a positive potential to the first electrode portions EP1 and may apply a second voltage having a negative potential to the third electrode portions EP3. The second power VD2 may be electrically connected to the second electrode ED2 and the fourth electrode ED4. The second power VD2 may provide a direct current voltage to the second electrode ED2 and the fourth electrode ED4. The second power VD2 may apply a third voltage having a positive potential to the second electrode portions EP2 and may apply a fourth voltage having a negative potential to the fourth electrode portions EP4.

When viewed in a plane, the first area AR1 may overlap the first transistor T1 (refer to FIG. 2), the second transistor T2 (refer to FIG. 2), the connection signal line SCL (refer to FIG. 2), and the electrode AE (refer to FIG. 2). An electrostatic induction in an insulator and a conductor may occur in the first area AR1 by the first power VD1.

When the first voltage is applied to the first electrode portions EP1, a dielectric polarization phenomenon and an electron transfer phenomenon may occur in the first area AR1 of the substrate SUB (refer to FIG. 2) disposed adjacent to the first electrode portions EP1. When viewed in a plane, the first area AR1 overlapping the first electrode portions EP1 may be charged with the negative potential. When viewed in the plane, a surface of the first area AR1 overlapping the first electrode portions EP1 may have a negative charge. An attractive force may be generated between the electrostatic chuck ESC and the substrate SUB (refer to FIG. 2) due to the electrostatic force between the positive charge of the first voltage applied to the first electrode portions EP1 and the negative charge of the surface of the first area AR1 overlapping the first electrode portions EP1 when viewed in the plane.

When a second voltage is applied to the third electrode portions EP3, the dielectric polarization phenomenon and the electron transfer phenomenon may occur in the first area AR1 of the substrate SUB (refer to FIG. 2) disposed adjacent to the third electrode portions EP3. When viewed in a plane, the first area AR1 overlapping the third electrode portions EP3 may be charged with the positive potential. When viewed in the plane, the surface of the first area AR1 overlapping the third electrode portions EP3 may have a positive charge. An attractive force may be generated between the electrostatic chuck ESC and the substrate SUB (refer to FIG. 2) due to the electrostatic force between the negative charge of the second voltage applied to the third electrode portions EP3 and the positive charge of the surface of the first area AR1 overlapping the third electrode portions EP3 when viewed in the plane.

The second power VD2 may be electrically connected to the second electrode ED2 and the fourth electrode ED4. The second power VD2 may provide a direct current voltage. The second power VD2 may provide the third voltage to the second electrode portions EP2. The second power VD2 may provide a fourth voltage to the fourth electrode portions EP4.

When viewed in a plane, the second area AR2 may overlap the base layer BL (refer to FIG. 2). An electrostatic induction in an insulator may occur in the second area AR2 by the second power VD2.

When the third voltage is applied to the second electrode portions EP2, the dielectric polarization phenomenon may occur in the second area AR2 of the substrate SUB (refer to FIG. 2) disposed adjacent to the second electrode portions EP2. When viewed in a plane, the second area AR2 overlapping the second electrode portions EP2 may be charged with the negative potential. When viewed in the plane, a surface of the second area AR2 overlapping the second electrode portions EP2 may have a negative charge. An attractive force may be generated between the electrostatic chuck ESC and the substrate SUB (refer to FIG. 2) due to the electrostatic force between the positive charge of the third voltage applied to the second electrode portions EP2 and the negative charge of the surface of the second area AR2 overlapping the second electrode portions EP2 when viewed in the plane.

When the fourth voltage is applied to the fourth electrode portions EP4, the dielectric polarization phenomenon may occur in the second area AR2 of the substrate SUB (refer to FIG. 2) disposed adjacent to the fourth electrode portions EP4. When viewed in a plane, the second area AR2 overlapping the fourth electrode portions EP4 may be charged with the positive potential. When viewed in the plane, the surface of the second area AR2 overlapping the fourth electrode portions EP4 may have a positive charge. An attractive force may be generated between the electrostatic chuck ESC and the substrate SUB (refer to FIG. 2) due to the electrostatic force between the negative charge of the fourth voltage applied to the fourth electrode portions EP4 and the positive charge of the surface of the second area AR2 overlapping the fourth electrode portions EP4 when viewed in the plane.

According to the present disclosure, the first width WEP1 of each of the first electrode portions EP1 and the third width WEP3 of each of the third electrode portions EP3 may be greater than the second width WEP2 of each of the second electrode portions EP2 and the fourth width WEP4 of each of the fourth electrode portions EP4. The first electrode portions EP1 disposed in the first area AR1 may have an area greater than an area of the second electrode portions EP2 disposed in the second area AR2. When the same voltage is applied, the attractive force caused by the electrostatic force in the first area AR1 may be stronger than the attractive force caused by the electrostatic force in the second area AR2. Accordingly, although a voltage applied to the first and third electrodes ED1 and ED3 disposed in the first area AR1 is lower than a voltage applied to the second and fourth electrodes ED2 and ED4 disposed in the second area AR2, the electrostatic force to chuck the substrate SUB (refer to FIG. 2) may be secured.

According to the present disclosure, the first power VD1 and the second power VD2 may be electrically connected to electrodes disposed in separate areas, respectively, and may independently apply different voltages for each area. Thus, the electrostatic force of the electrostatic chuck applied to the substrate SUB (refer to FIG. 2) may be controlled.

Figure 6:
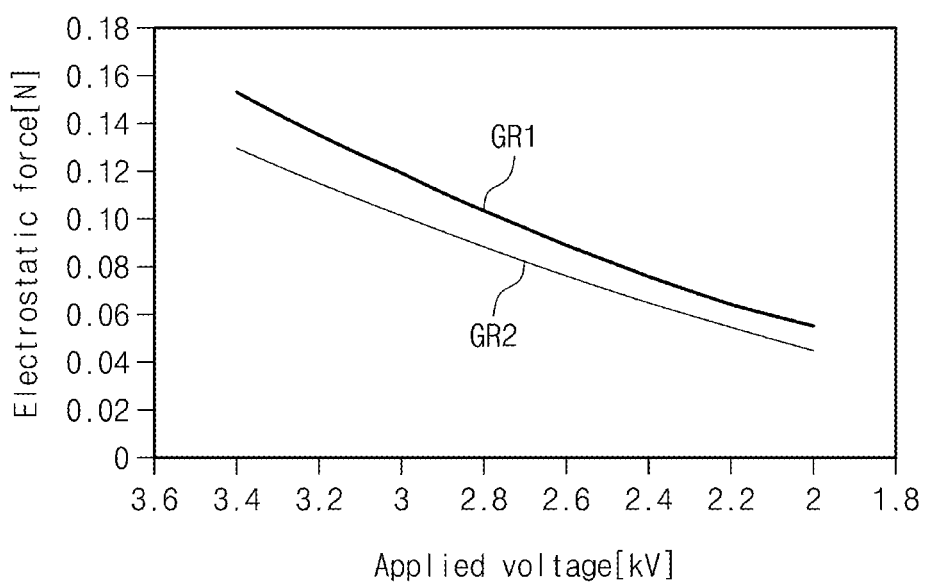
FIG. 6 is a graph showing a relationship between an applied voltage and an electrostatic force according to an embodiment of the present disclosure.

FIG. 6 is a graph showing a relationship between an applied voltage and an electrostatic force according to an embodiment of the present disclosure.

Referring to FIGS. 5 and 6, a first graph GR1 shows the electrostatic force formed when the applied voltage is provided to the first electrode ED1 and the third electrode ED3, which are disposed in the first area AR1. A second graph GR2 shows the electrostatic force formed when the applied voltage is provided to the second electrode ED2 and the fourth electrode ED4, which are disposed in the second area AR2. The first graph GR1 and the second graph GR2 may be in proportion to a square of the applied voltage.

When the applied voltage is constant, the electrostatic force formed when the applied voltage is provided to the first electrode ED1 and the third electrode ED3 may be higher than the electrostatic force formed when the applied voltage is provided to the second electrode ED2 and the fourth electrode ED4. That is, the applied voltage that is required for the first and third electrodes ED1 and ED3 to secure the same electrostatic force as that of the second and fourth electrodes ED2 and ED4 may be lower than the applied voltage applied to the second and fourth electrodes ED2 and ED4. For example, the first power VD1 may provide the applied voltage of about 3.4 kV, and the second power VD2 may provide the applied voltage of about 3 kV lower than about 3.4 kV in order to secure the electrostatic force equal to or greater than about 0.12N required for the electrostatic chuck ESC to chuck the substrate SUB (refer to FIG. 2).

When a high voltage is applied to secure a certain electrostatic force for the chucking of the substrate SUB (refer to FIG. 2), electric charges may be accumulated in the electrostatic chuck due to a leakage current. In this case, when the substrate SUB (refer to FIG. 2) is dechucked, the dechuking operation may be unstable due to a residual stress caused by the accumulated electric charges. However, according to the present disclosure, since the first and third widths WEP1 and WEP3 are greater than the second and fourth widths WEP2 and WEP4, the electrostatic force that is appropriate to stably chuck the substrate SUB (refer to FIG. 2) may be secured even though the voltage applied to the first and third electrodes ED1 and ED3 is lower than the voltage applied to the second and fourth electrodes ED2 and ED4. In addition, since the voltage applied to the first area AR1 is lower than the voltage applied to the second area AR2, a possibility that the electric charges are accumulated in the first area AR1 due to the leakage current may decrease. Accordingly, the dechucking operation between the electrostatic chuck ESC and the substrate SUB (refer to FIG. 2) may be stably performed. Therefore, a process reliability of the electrostatic chuck ESC may be improved.

In addition, according to the present disclosure, since the first and third widths WEP1 and WEP3 are greater than the second and fourth widths WEP2 and WEP4, the electrostatic chuck ESC may secure the electrostatic force that is appropriate to stably chuck the substrate SUB (refer to FIG. 2) even though the voltage applied to the first and third electrodes ED1 and ED3 is lower than the voltage applied to the second and fourth electrodes ED2 and ED4. Accordingly, a possibility that the first and third electrodes ED1 and ED3 are damaged by the high voltage may be reduced. Thus, the process reliability of the electrostatic chuck ESC may be improved.

Figure 7:
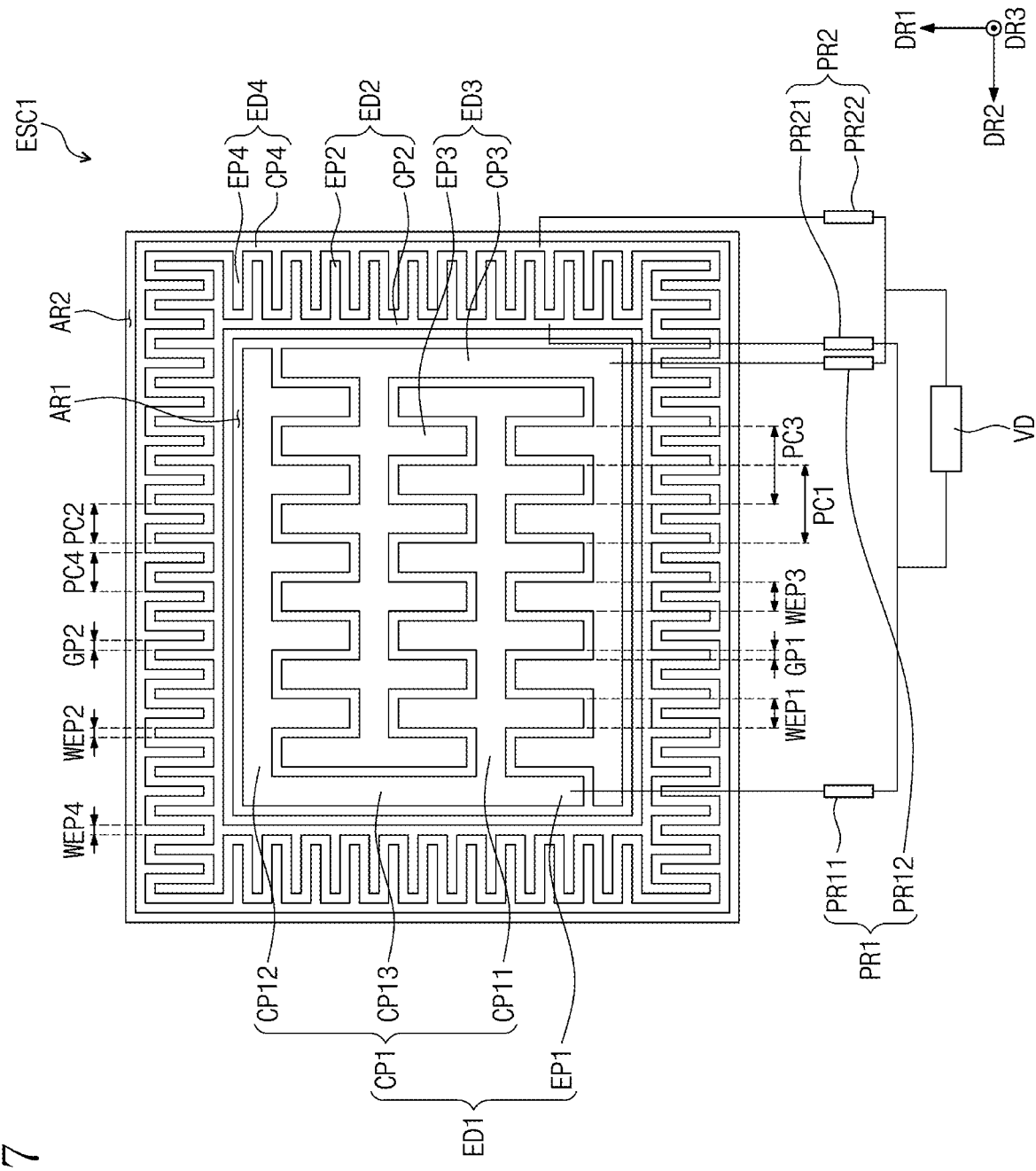
FIG. 7 is a plan view showing some of components of an electrostatic chuck according to an embodiment of the present disclosure.

FIG. 7 is a view showing some of components of an electrostatic chuck ESC1 according to an embodiment of the present disclosure. In FIG. 7, the same reference numerals denote the same elements in FIG. 5, and thus, detailed descriptions of the same elements will be omitted.

Referring to FIG. 7, the electrostatic chuck ESC1 may include a first electrode ED1, a second electrode ED2, a third electrode ED3, a fourth electrode ED4, a power VD, a first resistance member PR1, and a second resistance member PR2.

The power VD may provide a direct current voltage to the electrostatic chuck ESC1. For example, the power VD may be electrically connected to the first electrode ED1 and the third electrode ED3. The power VD may provide a voltage to a plurality of first electrode portions EP1 and a plurality of third electrode portions EP3. The power VD may be electrically connected to the second electrode ED2 and the fourth electrode ED4. The power VD may provide a voltage to a plurality of second electrode portions EP2 and a plurality of fourth electrode portions EP4.

The first resistance member PR1 may include a first variable resistor PR11 electrically connected between the first electrode portions EP1 and the power VD. The second resistance member PR2 may include a second variable resistor PR21 electrically connected between the second electrode portions EP2 and the power VD. The first variable resistor PR11 may have a resistance value greater than that of the second variable resistor PR21. The first variable resistor PR11 may drop the voltage to apply a first voltage to the first electrode portions EP1. The second variable resistor PR21 may drop the voltage to apply a second voltage to the second electrode portions EP2. The first voltage may be lower than the second voltage.

The first resistance member PR1 may further include a third variable resistor PR12 electrically connected between the third electrode portions EP3 and the power VD. The second resistance member PR2 may further include a fourth variable resistor PR22 electrically connected between the fourth electrode portions EP4 and the power VD.

According to the present disclosure, a first width WEP1 of each of the first electrode portions EP1 and a third width WEP3 of each of the third electrode portions EP3 may be greater than a second width WEP2 of each of the second electrode portions EP2 and a fourth width WEP4 of each of the fourth electrode portions EP4. The first electrode portions EP1 disposed in the first area AR1 may have an area greater than an area of the second electrode portions EP2 disposed in the second area AR2. When the voltage is applied to the electrostatic chuck ESC, the electrostatic force to chuck the substrate SUB (refer to FIG. 2) may be secured even though the first voltage applied to the first area AR1 is lower than the second voltage applied to the second area AR2.

According to the present disclosure, the power VD to which the variable resistors PR11, RP12, PR21, and PR22 are connected may independently provide different voltages for respective areas to electrodes disposed in separate areas, and thus, the electrostatic force of the electrostatic chuck ESC1, which is applied to the substrate SUB (refer to FIG. 2), may be controlled.

Figure 8A:
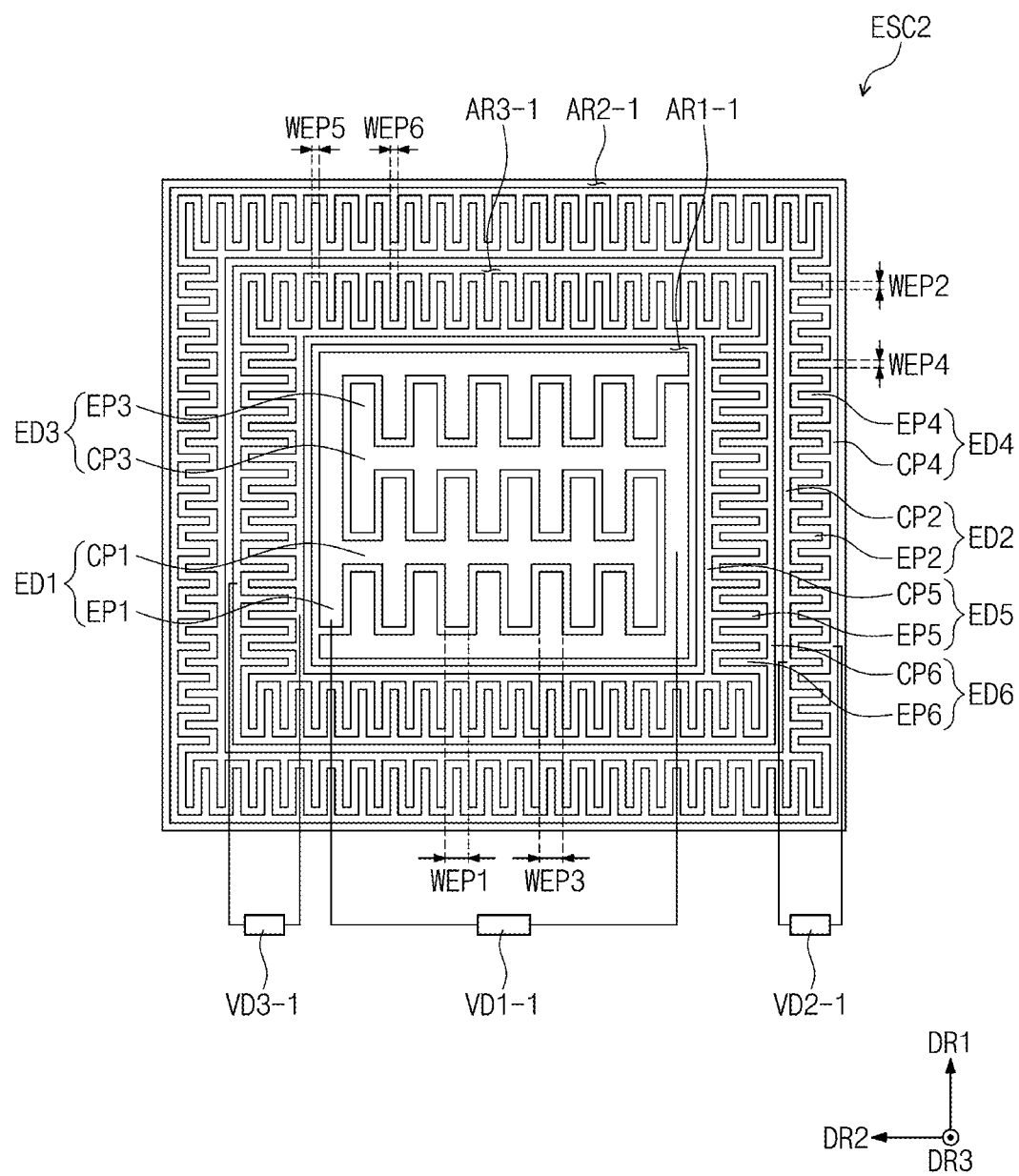
FIG. 8A is a plan view showing some of components of an electrostatic chuck according to an embodiment of the present disclosure.

FIG. 8A is a view showing some of components of an electrostatic chuck ESC2 according to an embodiment of the present disclosure. In FIG. 8A, the same reference numerals denote the same elements in FIG. 5, and thus, detailed descriptions of the same elements will be omitted.

Referring to FIG. 8A, the electrostatic chuck ESC2 may include a first electrode ED1, a second electrode ED2, a third electrode ED3, a fourth electrode ED4, a fifth electrode ED5, a sixth electrode ED6, a first power VD1-1, a second power VD2-1, and a third power VD3-1.

The electrostatic chuck ESC2 may include a first area AR1-1, a second area AR2-1, and a third area AR3-1, which are defined therein. The second area AR2-1 may surround the third area AR3-1. The third area AR3-1 may be disposed between the first area AR1-1 and the second area AR2-1 and may surround the first area AR1-1.

The first electrode ED1 and the third electrode ED3 may be disposed in the first area AR1-1. The second electrode ED2 and the fourth electrode ED4 may be disposed in the second area AR2-1.

The fifth electrode ED5 may be disposed in the third area AR3-1. The fifth electrode ED5 may include a fifth connection portion CP5 and a plurality of fifth electrode portions EP5.

The fifth connection portion CP5 may be disposed along an inner periphery of the third area AR3-1. The fifth electrode portions EP5 may protrude from the fifth connection portion CP5. The fifth electrode portions EP5 may be referred to as a plurality of third electrode portions.

Each of the fifth electrode portions EP5 may have a fifth width WEP5. The fifth width WEP5 may be the same as a second width WEP2.

The sixth electrode ED6 may be disposed in the third area AR3-1. The sixth electrode ED6 may include a sixth connection portion CP6 and a plurality of sixth electrode portions EP6.

The sixth connection portion CP6 may be disposed along an outer periphery of the third area AR3-1. The sixth electrode portions EP6 may protrude from the sixth connection portion CP6.

Each of the sixth electrode portions EP6 may have a sixth width WEP6. The sixth width WEP6 may be the same as the second width WEP2.

The first power VD1-1 may be electrically connected between the first electrode ED1 and the third electrode ED3. The first power VD1-1 may provide a positive voltage to the first electrode ED1 and may provide a negative voltage to the third electrode ED3.

The second power VD2-1 may be electrically connected between the second electrode ED2 and the fourth electrode ED4. The second power VD2-1 may provide a positive voltage to the second electrode ED2 and may provide a negative voltage to the fourth electrode ED4.

The third power VD3-1 may be electrically connected between the fifth electrode ED5 and the sixth electrode ED6. The third power VD3-1 may provide a positive voltage to the fifth electrode ED5 and may provide a negative voltage to the sixth electrode ED6.

The first power VD1-1 may provide the voltage lower than that provided by each of the second power VD2-1 and the third power VD3-1.

According to the present disclosure, the first power VD1-1, the second power VD2-1, and the third power VD3-1 may be electrically connected to the electrodes disposed in separate areas and may independently provide different voltages to electrodes for each area, and thus, the electrostatic force of the electrostatic chuck ESC2, which is applied to the substrate SUB (refer to FIG. 2), may be controlled.

Figure 8B:
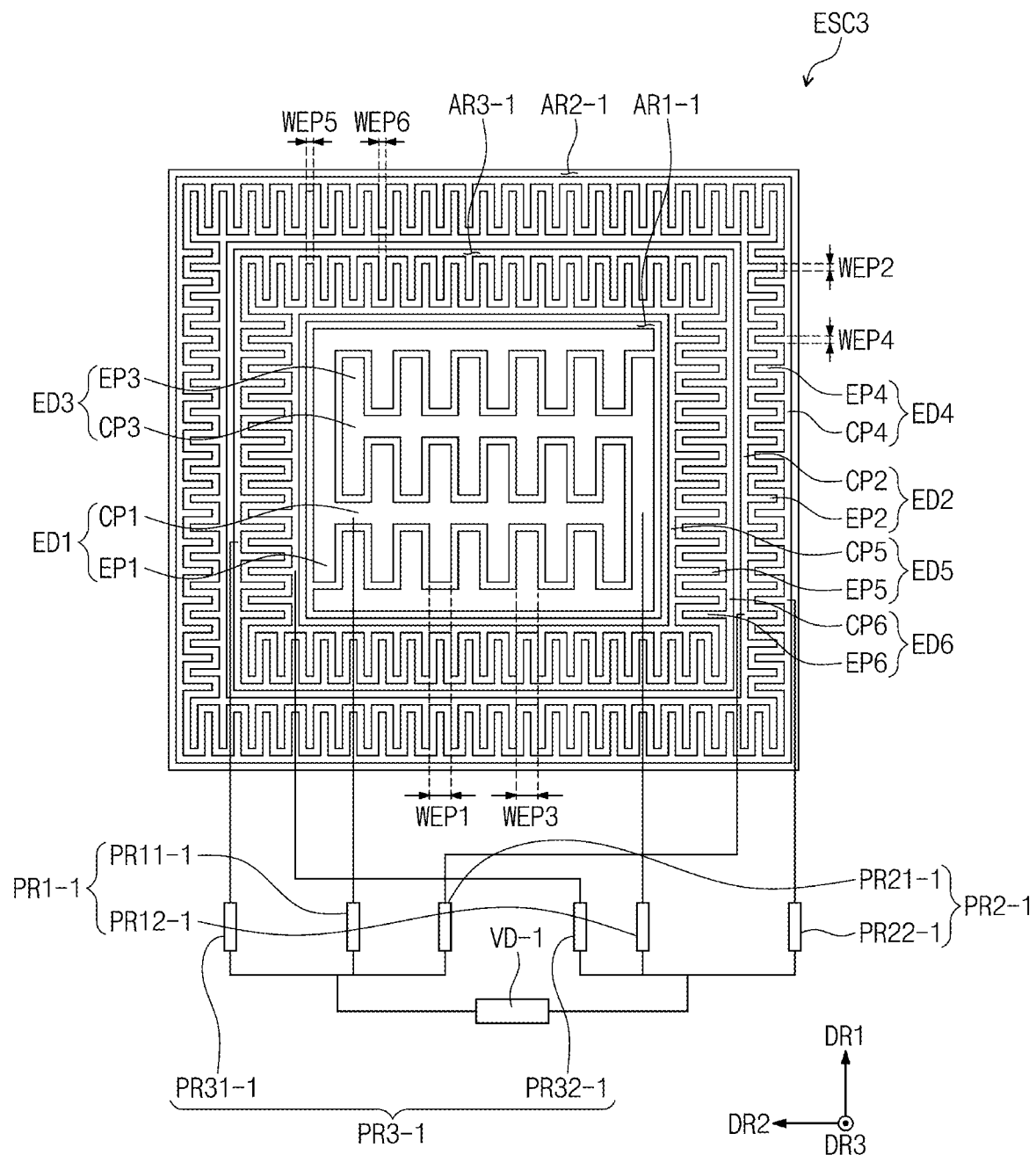
FIG. 8B is a plan view showing some of components of an electrostatic chuck according to an embodiment of the present disclosure.

FIG. 8B is a view showing some of components of an electrostatic chuck ESC3 according to an embodiment of the present disclosure. In FIG. 8B, the same reference numerals denote the same elements in FIGS. 5 and 8A, and thus, detailed descriptions of the same elements will be omitted.

Referring to FIG. 8B, the electrostatic chuck ESC3 may include a first electrode ED1, a second electrode ED2, a third electrode ED3, a fourth electrode ED4, a fifth electrode ED5, a sixth electrode ED6, a power VD-1, a first resistance member PR1-1, a second resistance member PR2-1, and a third resistance member PR3-1.

The power VD-1 may provide a direct current voltage to the electrostatic chuck ESC3. For example, the power VD-1 may be electrically connected to the first electrode ED1 and the third electrode ED3. The power VD-1 may provide a voltage to a plurality of first electrode portions EP1 and a plurality of third electrode portions EP3. The power VD-1 may be electrically connected to the second electrode ED2 and the fourth electrode ED4. The power VD-1 may provide a voltage to a plurality of second electrode portions EP2 and a plurality of fourth electrode portions EP4. The power VD-1 may be electrically connected to the fifth electrode ED5 and the sixth electrode ED6. The power VD-1 may provide a voltage to a plurality of fifth electrode portions EP5 and a plurality of sixth electrode portions EP6.

The first resistance member PR1-1 may include a first variable resistor PR11-1 electrically connected between the first electrode portions EP1 and the power VD-1. The second resistance member PR2-1 may include a second variable resistor PR21-1 electrically connected between the third electrode portions EP3 and the power VD-1. The third resistance member PR3-1 may include a third variable resistor PR31-1 electrically connected between the fifth electrode portions EP5 and the power VD-1.

The first variable resistor PR11-1 may be larger than the second variable resistor PR21-1. The first variable resistor PR11-1 may drop the voltage to apply a first voltage to the first electrode portions EP1. The second variable resistor PR21-1 may drop the voltage to apply a second voltage to the second electrode portions EP2. The first voltage may be lower than the second voltage. The third variable resistor PR31-1 may be smaller than the first variable resistor PR11-1. The third variable resistor PR31-1 may drop the voltage to apply a third voltage to the sixth electrode portions EP6. The first voltage may be lower than the third voltage.

The first resistance member PR1-1 may further include a fourth variable resistor PR12-1 electrically connected between the third electrode portions EP3 and the power VD-1. The second resistance member PR2-1 may further include a fifth variable resistor PR22-1 electrically connected between the fourth electrode portions EP4 and the power VD-1. The third resistance member PR3-1 may further include a sixth variable resistor PR32-1 electrically connected between the fifth electrode portions EP5 and the power VD-1.

According to the present disclosure, the power VD-1 to which the variable resistors are connected may be electrically connected to the electrodes disposed in separate areas and may independently provide different voltages to electrodes for each area, and thus, the electrostatic force of the electrostatic chuck ESC3, which is applied to the substrate SUB (refer to FIG. 2), may be controlled.

Figure 9A:
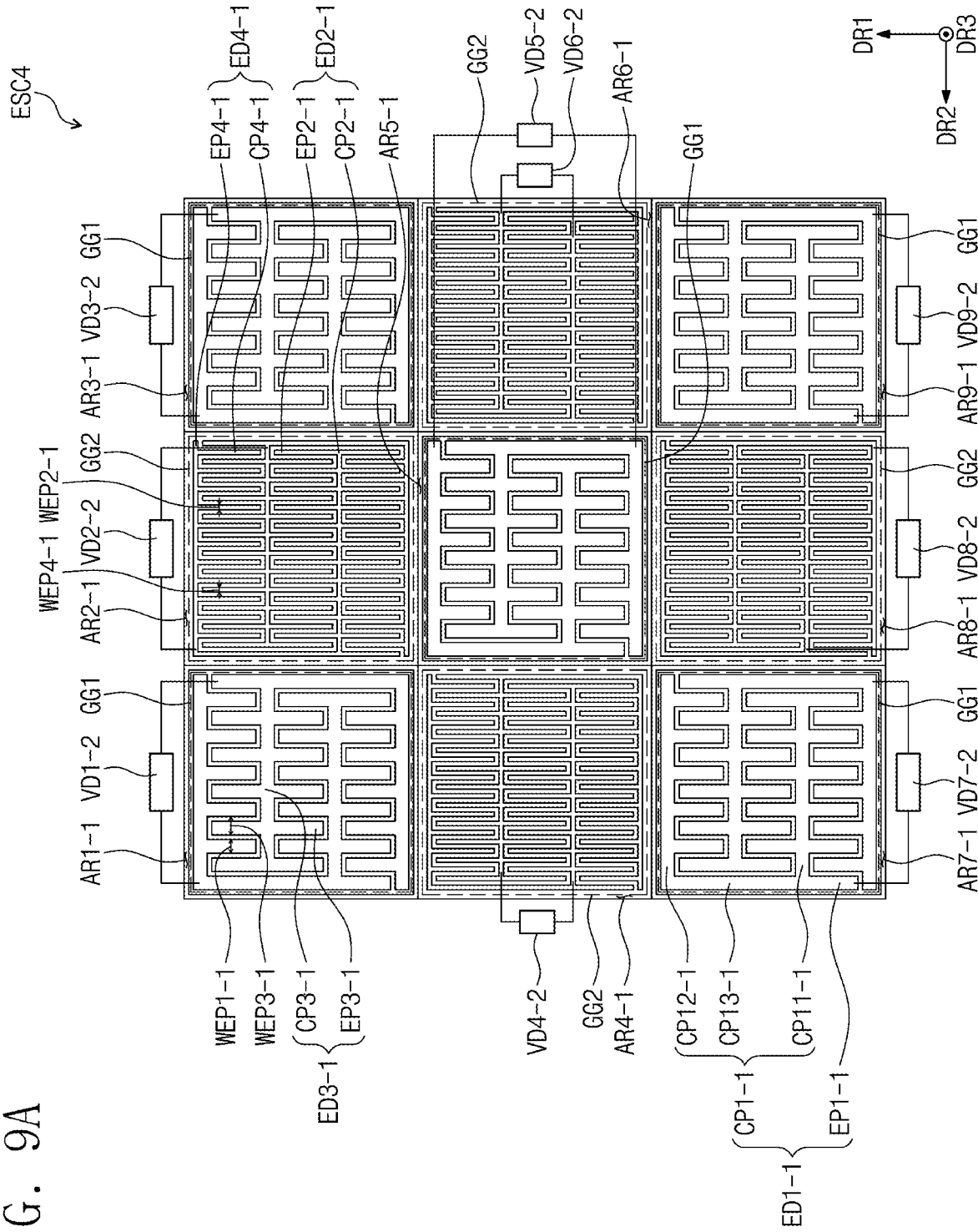
FIG. 9A is a plan view showing some of components of an electrostatic chuck according to an embodiment of the present disclosure.

FIG. 9A is a view showing some of components of an electrostatic chuck ESC4 according to an embodiment of the present disclosure.

Referring to FIG. 9A, the electronic chuck ESC4 may include a plurality of first groups GG1, a plurality of second groups GG2, a first power VD1-2, a second power VD2-2, a third power VD3-2, a fourth power VD4-2, a fifth power VD5-2, a sixth power VD6-2, a seventh power VD7-2, an eighth power VD8-2, and a ninth power VD9-2.

The electrostatic chuck ESC4 may include a first area AR1-1, a second area AR2-1 adjacent to the first area AR1-1, a third area AR3-1 adjacent to the second area AR2-1, a fourth area AR4-1 adjacent to the first area AR1-1, a fifth area AR5-1 adjacent to the fourth area AR4-1, a sixth area AR6-1 adjacent to the fifth area AR5-1, a seventh area AR7-1 adjacent to the fourth area AR4-1, an eighth area AR8-1 adjacent to the seventh area AR7-1, and a ninth area AR9-1 adjacent to the eighth area AR8-1, which are defined therein. For example, the electrostatic chuck ESC4 may include a plurality of areas arranged in three rows by three columns.

A first electrode ED1-1 may be disposed in the first area AR1-1. The first electrode ED1-1 may include a first connection portion CP1-1 and a plurality of first electrode portions EP1-1.

The first connection portion CP1-1 may include a first portion CP11-1, a second portion CP12-1, and a third portion CP13-1. The first portion CP11-1 may extend in a second direction DR2, and the second portion CP12-1 may extend in the second direction DR2 and may be spaced apart from the first portion CP11-1 in a first direction DR1. The third portion CP13-1 may extend in the first direction DR1 from one end of the first portion CP11-1 and one end of the second portion CP12-1.

The first electrode portions EP1-1 may protrude from the first connection portion CP1-1. Each of the first electrode portions EP1-1 may have a first width WEP1-1. The first width WEP1-1 may be in a range from about 3 millimeters to about 10 millimeters.

A second electrode ED2-1 may be disposed in the second area AR2-1. The second electrode ED2-1 may include a second connection portion CP2-1 and a plurality of second electrode portions EP2-1.

The second connection portion CP2-1 may have a shape corresponding to a shape of the first connection portion CP1-1. The second electrode portions EP2-1 may protrude from the second connection portion CP2-1. Each of the second electrode portions EP2-1 may have a second width WEP2-1. The second width WEP2-1 may be smaller than the first width WEP1-1. The second width WEP2-1 may be in a range from about 1 millimeter to about 2 millimeters.

A third electrode ED3-1 may be disposed in the first area AR1-1. The third electrode ED3-1 may include a third connection portion CP3-1 and a plurality of third electrode portions EP3-1.

The third connection portion CP3-1 may be spaced apart from the first connection portion CP1-1 and may have a shape surrounding a portion of the first connection portion CP1-1. The third electrode portions EP3-1 may protrude from the third connection portion CP3-1. Each of the third electrode portions EP3-1 may have a third width WEP3-1. The third width WEP3-1 may be the same as the first width WEP1-1.

The first electrode portions EP1-1 may be alternately arranged with the third electrode portions EP3-1.

A fourth electrode ED4-1 may be disposed in the second area AR2-1. The fourth electrode ED4-1 may include a fourth connection portion CP4-1 and a plurality of fourth electrode portions EP4-1.

The fourth connection portion CP4-1 may be spaced apart from the second connection portion CP2-1 and may have a shape surrounding a portion of the second connection portion CP2-1. The fourth electrode portions EP4-1 may protrude from the fourth connection portion CP4-1. Each of the fourth electrode portions EP4-1 may have a fourth width WEP4-1. The fourth width WEP4-1 may be the same as the second width WEP2-1.

The first group GG1 may include the first electrode ED1-1 and the third electrode ED3-1, and the second group GG1 may include the second electrode ED2-1 and the fourth electrode ED4-1.

The first group GG1 may be disposed in the first area AR1-1, the third area AR3-1, the fifth area AR5-1, the seventh area AR7-1, and the ninth area AR9-1.

The second group GG2 may be disposed in the second area AR2-1, the fourth area AR4-1, the sixth area AR6-1, and the eighth area AR8-1.

The first power VD1-2 may be electrically connected to the electrode disposed in the first area AR1-1. The second power VD2-2 may be electrically connected to the electrode disposed in the second area AR2-1. The third power VD3-2 may be electrically connected to the electrode disposed in the third area AR3-1. The fourth power VD4-2 may be electrically connected to the electrode disposed in the fourth area AR4-1. The fifth power VD5-2 may be electrically connected to the electrode disposed in the fifth area AR5-1. The sixth power VD6-2 may be electrically connected to the electrode disposed in the sixth area AR6-1. The seventh power VD7-2 may be electrically connected to the electrode disposed in the seventh area AR7-1. The eighth power VD8-2 may be electrically connected to the electrode disposed in the eighth area AR8-1. The ninth power VD9-2 may be electrically connected to the electrode disposed in the ninth area AR9-1.

According to the present disclosure, the first power VD1-2, the second power VD2-2, the third power VD3-2, the fourth power VD4-2, the fifth power VD5-2, the sixth power VD6-2, the seventh power VD7-2, the eighth power VD8-2, and the ninth power VD9-2 may be electrically connected to the electrodes disposed in separate areas, respectively, and may independently provide the same voltage or different voltages to the electrodes for each area, and thus, the electrostatic force of the electrostatic chuck ESC4, which is applied to the substrate SUB (refer to FIG. 2), may be controlled.

According to the present disclosure, the width of each of the first electrode portions EP1 and the width of each of the third electrode portions EP3, which are disposed in the first group GG1, may be greater than the width of each of the second electrode portions EP2 and the width of each of the fourth electrode portions EP4, which are disposed in the second group GG2. An area of each of the first electrode portions EP1 and an area of each of the third electrode portions EP3, which are disposed in the first group GG1, may be greater than an area of each of the second electrode portions EP2 and an area of each of the fourth electrode portions EP4, which are disposed in the second group GG2. When the same voltage is applied, the first group GG1 may have an attractive force, which is caused by the electrostatic force, stronger than that of the second group GG2. The first group GG1 may be disposed to correspond to a center portion and a plurality of corner portions of the substrate SUB (refer to FIG. 2). The center portion may correspond to the fifth area AR5-1 of the electrostatic chuck ESC4, and the corner portions may be respectively correspond to the first area AR1-1, the third area AR3-1, the seventh area AR7-1, and the ninth area AR9-1. Accordingly, the electrostatic chuck ESC4 may secure the electrostatic force applied to the center portion and the corner portions of the substrate SUB2 (refer to FIG. 2).

Figure 9B:
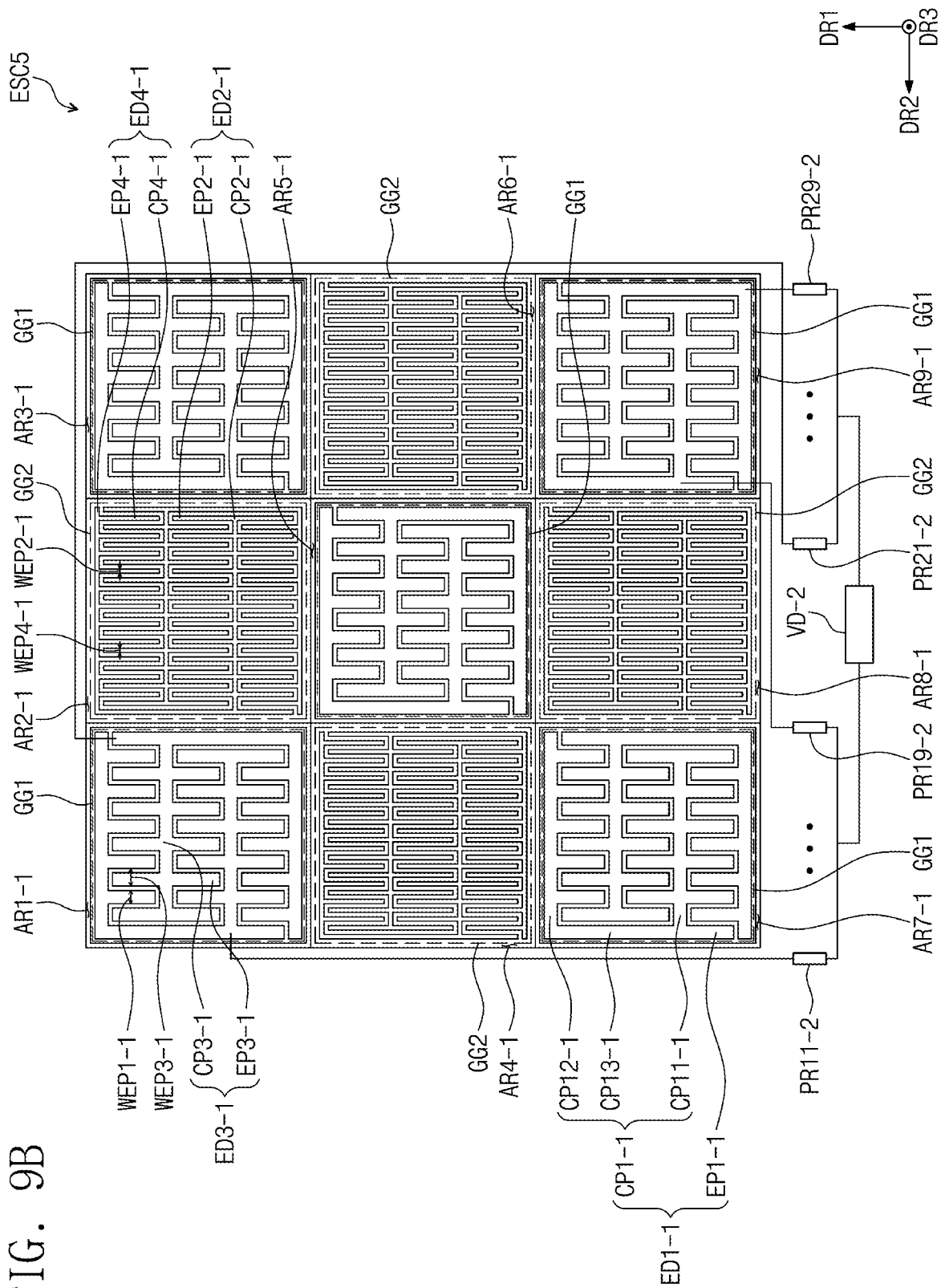
FIG. 9B is a plan view showing some of components of an electrostatic chuck according to an embodiment of the present disclosure.

FIG. 9B is a view showing some of components of an electrostatic chuck ESC5 according to an embodiment of the present disclosure. In FIG. 9B, the same reference numerals denote the same elements in FIG. 9A, and thus, detailed descriptions of the same elements will be omitted.

Referring to FIG. 9B, the electrostatic chuck ESC5 may include a plurality of first groups GG1, a plurality of second groups GG2, a power VD-2, a plurality of first variable resistors PR11-2 to PR19-2, and a plurality of second variable resistors PR21-2 to PR29-2.

The power VD-2 may provide a direct current voltage to the electrostatic chuck ESC5.

The first variable resistors PR11-2 to PR19-2 and the second variable resistors PR21-2 to PR29-2 may be electrically connected between electrodes disposed in a plurality of areas AR1-1 to AR9-1 and the power VD-2.

Among the first variable resistors PR11-2 to PR19-2 and the second variable resistors PR21-2 to PR29-2, the variable resistors connected to the first groups GG1 may have the same resistance value as each other. Among the first variable resistors PR11-2 to PR19-2 and the second variable resistors PR21-2 to PR29-2, the variable resistors connected to the second groups GG2 may have the same resistance value as each other. However, this is merely exemplary, and the resistance value of each of the first variable resistors PR11-2 to PR19-2 and the second variable resistors PR21-2 to PR29-2 should not be limited thereto or thereby. For example, the variable resistors connected to the first groups GG1 may have different resistances from each other, and the variable resistors connected to the second groups GG2 may have different resistances from each other to control the electrostatic force of the electrostatic chuck ESC5 for each area of the electrostatic chuck ESC5.

According to the present disclosure, the power VD-2 to which the first variable resistors PR11-2 to PR19-2 and the second variable resistors PR21-2 to PR29-2 are connected may be electrically connected to the electrodes disposed in separate areas and may provide the same voltage or different voltages to the electrodes for each area, and thus, the electrostatic force of the electrostatic chuck ESC5, which is applied to the substrate SUB (refer to FIG. 2), may be controlled.

In FIG. 9B, each of the number of the first variable resistors PR11-2 to PR19-2 and the number of the second variable resistors PR21-2 to PR29-2 is the same as the number of the areas defined in the electrostatic chuck ESC5, however, the present disclosure should not be limited thereto or thereby. For example, each of the number of the first variable resistors PR11-2 to PR19-2 and the number of the second variable resistors PR21-2 to PR29-2 may be smaller than the number of the areas defined in the electrostatic chuck ESC5.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electrostatic chuck that fixes a substrate and comprises a first area defined therein and a second area adjacent to the first area and defined therein, the electrostatic chuck comprising:
   a first electrode portion disposed in the first area and having a first width;
   a second electrode portion disposed in the second area and having a second width smaller than the first width;
   a third electrode portion disposed in the first area and spaced apart from the first electrode portion by a first gap; and
   a fourth electrode portion disposed in the second area and spaced apart from the second electrode portion by a second gap, wherein the first gap is smaller than the first width, and the second gap is equal to the second width.

2. The electrostatic chuck of claim 1, wherein the first width is in a range from about 3 millimeters to about 10 millimeters, and the second width is in a range from about 1 millimeter to about 2 millimeters.

3. The electrostatic chuck of claim 1, wherein the second area surrounds the first area.

4. The electrostatic chuck of claim 1, further comprising:
   a first power source providing a first voltage to the first electrode portion; and
   a second power source providing a second voltage to the second electrode portion.

5. The electrostatic chuck of claim 4, wherein the first voltage is lower than the second voltage.

6. The electrostatic chuck of claim 1, further comprising:
   a power source providing a voltage to the first electrode portion and the second electrode portion;
   a first variable resistor electrically connected between the first electrode portion and the power source; and
   a second variable resistor electrically connected between the second electrode portion and the power source.

7. The electrostatic chuck of claim 6, wherein the first variable resistor has a resistance value greater than a resistance value of the second variable resistor.

8. The electrostatic chuck of claim 1, wherein the first gap is equal to or greater than the second gap.

9. The electrostatic chuck of claim 1, wherein the first gap is in a range from about 1 millimeter to about 1.5 millimeters, and the second gap is about 1 millimeter.

10. The electrostatic chuck of claim 1, wherein each of the first electrode portion, the second electrode portion, the third electrode portion, and the fourth electrode portion is provided in plural, the first electrode portions are alternately arranged with the third electrode portions, and the second electrode portions are alternately arranged with the fourth electrode portions.

11. An electrostatic chuck that fixes a substrate and comprises a first area defined therein and a second area adjacent to the first area and defined therein, the electrostatic chuck comprising:
    a first electrode portion disposed in the first area and having a first width;
    a second electrode portion disposed in the second area and having a second width smaller than the first width;
    a third area that is defined therein to be disposed between the first area and the second area and to surround the first area; and
    a third electrode portion disposed in the third area, wherein the first electrode portion, the second electrode portion, and the third electrode portion receive different voltages from each other.

12. The electrostatic chuck of claim 11, further comprising:
    a first power source providing a first voltage to the first electrode portion;
    a second power source providing a second voltage different from the first voltage to the second electrode portion; and
    a third power source providing a third voltage different from the first and second voltages to the third electrode portion.

13. The electrostatic chuck of claim 11, further comprising:
    a power source providing the voltages;
    a first variable resistor electrically connected between the power source and the first electrode portion;
    a second variable resistor electrically connected between the power source and the second electrode portion; and
    a third variable resistor electrically connected between the power source and the third electrode portion.

14. The electrostatic chuck of claim 13, wherein the first variable resistor has a resistance value greater than a resistance value of each of the second and third variable resistors.

15. An electrostatic chuck configured to fix a substrate and having a plurality of areas defined therein, the electrostatic chuck comprising:
    a plurality of first electrode portions disposed in a first area among the plurality of areas;
    a plurality of second electrode portions disposed in a second area among the plurality of areas;
    a plurality of third electrode portions disposed in the first area; and
    a plurality of fourth electrode portions disposed in the second area, wherein the first electrode portions are arranged at a first pitch, the second electrode portions are arranged at a second pitch smaller than the first pitch, the third electrode portions are arranged at a pitch that is equal to the first pitch, and the fourth electrode portions are arranged at a pitch that is equal to the second pitch.

16. The electrostatic chuck of claim 15, wherein the first electrode portions are alternately arranged with the third electrode portions, the first electrode portions and the third electrode portions have a first width, the second electrode portions are alternately arranged with the fourth electrode portions, and the second electrode portions and the fourth electrode portions have a second width equal to or smaller than the first width.

17. The electrostatic chuck of claim 15, wherein a first voltage is applied to the first electrode portions, and a second voltage higher than the first voltage is applied to the second electrode portions.

18. The electrostatic chuck of claim 17, further comprising:
   a power source providing a voltage to the first electrode portions, the second electrode portions, the third electrode portions, and the fourth electrode portions;
   a first variable resistor electrically connected between the first electrode portions and the power source and dropping the voltage to the first voltage; and
   a second variable resistor electrically connected between the second electrode portions and the power source and dropping the voltage to the second voltage.

19. The electrostatic chuck of claim 17, further comprising:
   a first power source providing the first voltage; and
   a second power source providing the second voltage.

* * * * *